US010760910B2

(12) United States Patent
Gando et al.

(10) Patent No.: US 10,760,910 B2
(45) Date of Patent: Sep. 1, 2020

(54) SENSOR DEVICE EMPLOYING MEMS

(71) Applicant: KABUSHIKI KAISHA TOSHIBA, Tokyo (JP)

(72) Inventors: Ryunosuke Gando, Kanagawa (JP); Tamio Ikehashi, Kanagawa (JP); Yasushi Tomizawa, Tokyo (JP); Etsuji Ogawa, Kanagawa (JP); Shunta Maeda, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 158 days.

(21) Appl. No.: 15/908,730

(22) Filed: Feb. 28, 2018

(65) Prior Publication Data

US 2019/0078886 A1 Mar. 14, 2019

(30) Foreign Application Priority Data

Sep. 14, 2017 (JP) .................................. 2017-177060

(51) Int. Cl.
*G01C 19/5755* (2012.01)
*G01C 19/5769* (2012.01)
*G01C 19/5733* (2012.01)
*B81B 3/00* (2006.01)

(52) U.S. Cl.
CPC ........ *G01C 19/5755* (2013.01); *B81B 3/0054* (2013.01); *G01C 19/5733* (2013.01); *G01C 19/5769* (2013.01); *B81B 2201/0242* (2013.01)

(58) Field of Classification Search
CPC ............ G01C 19/5762; G01C 19/5726; G01C 19/5755; G01C 19/5769; G01C 19/5733; G01C 19/5719
See application file for complete search history.

(56) References Cited

U.S. PATENT DOCUMENTS

| 2002/0134155 | A1* | 9/2002 | Ishitoko | G01C 19/5663 73/504.12 |
| 2008/0078246 | A1 | 4/2008 | Li | |
| 2009/0320592 | A1* | 12/2009 | Glenn | B81B 3/0051 73/504.12 |

(Continued)

FOREIGN PATENT DOCUMENTS

| JP | 2003-75151 A | 3/2003 |
| JP | 2013-127413 | 6/2013 |

(Continued)

OTHER PUBLICATIONS

Gando et al., "An Intermittent Free-Vibration MEMS Gyroscope Enabled by Catch-and-Release Mechanism for Low-Power and Fast-Startup Applications," MEMS 2017 (Jan. 22-26, 2017), pp. 29-32.

*Primary Examiner* — Helen C Kwok
(74) *Attorney, Agent, or Firm* — Finnegan, Henderson, Farabow, Garrett & Dunner, L.L.P.

(57) ABSTRACT

According to one embodiment, a sensor device includes a movable body capable of vibrating, and a catch-and-release mechanism capable of catching the vibrating movable body and capable of releasing the caught movable body. The catch-and-release mechanism includes a stopper portion capable of stopping vibration of the movable body when the movable body contacts the stopper portion, and an elastic member configured to reduce a force acting between the movable body and the stopper portion.

13 Claims, 10 Drawing Sheets

(56) References Cited

U.S. PATENT DOCUMENTS

| | | | | |
|---|---|---|---|---|
| 2010/0236327 A1* | 9/2010 | Mao | ............... | G01C 19/5719 |
| | | | | 73/504.12 |
| 2014/0260613 A1* | 9/2014 | Qiu | ............... | G01C 19/5733 |
| | | | | 73/504.15 |
| 2016/0298966 A1* | 10/2016 | Ikehashi | ............ | G01C 19/5726 |
| 2016/0349056 A1 | 12/2016 | Thompson et al. | | |
| 2017/0268878 A1* | 9/2017 | Yamamoto | ......... | G01C 19/5733 |
| 2018/0164100 A1* | 6/2018 | Hatakeyama | ...... | G01C 19/5762 |
| 2019/0265035 A1* | 8/2019 | Hatakeyama | ...... | G01C 19/5733 |

FOREIGN PATENT DOCUMENTS

| | | |
|---|---|---|
| JP | 2016-200512 | 12/2016 |
| JP | 2017-166974 | 9/2017 |

\* cited by examiner

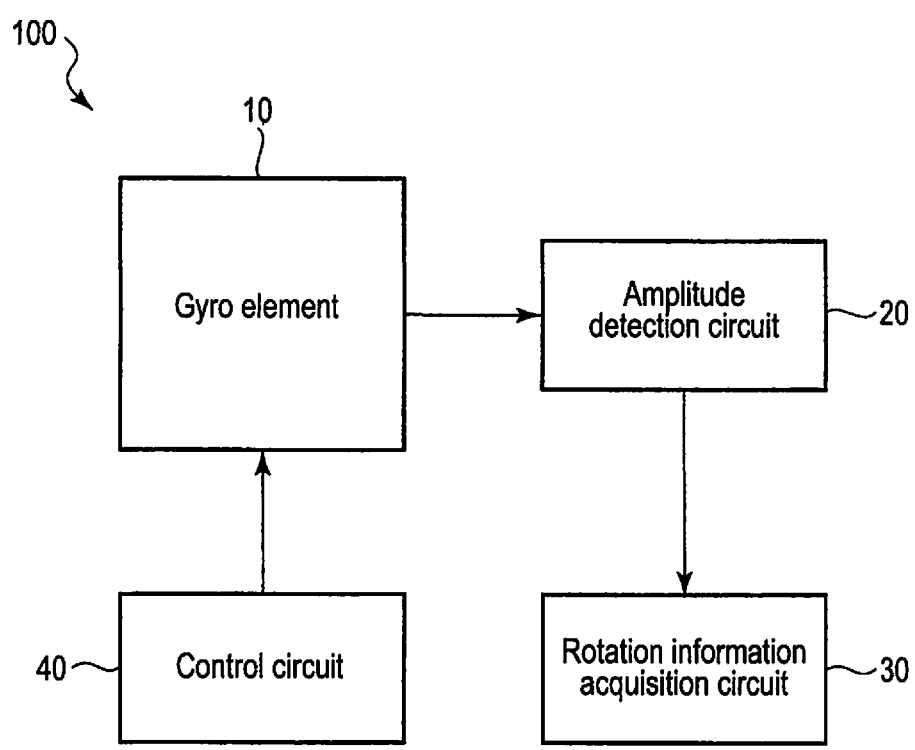
F I G. 1

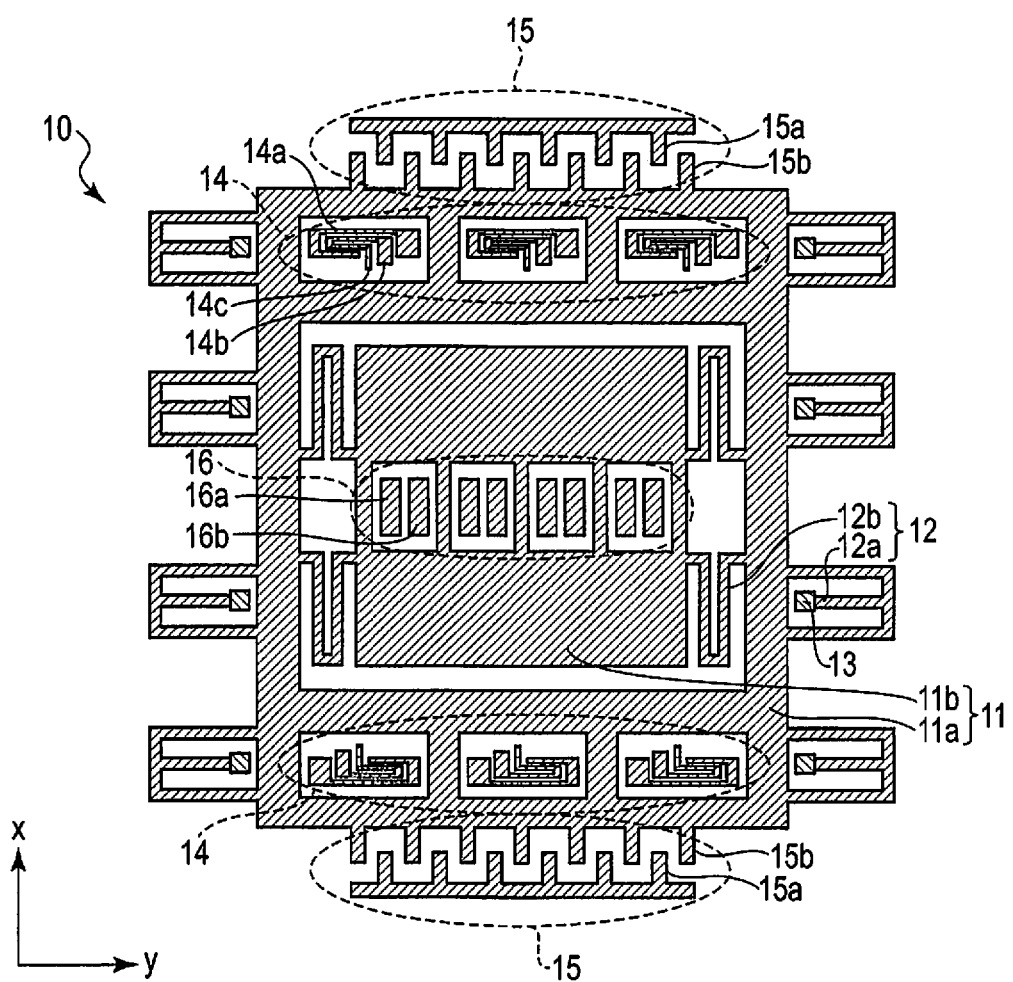
F I G. 2

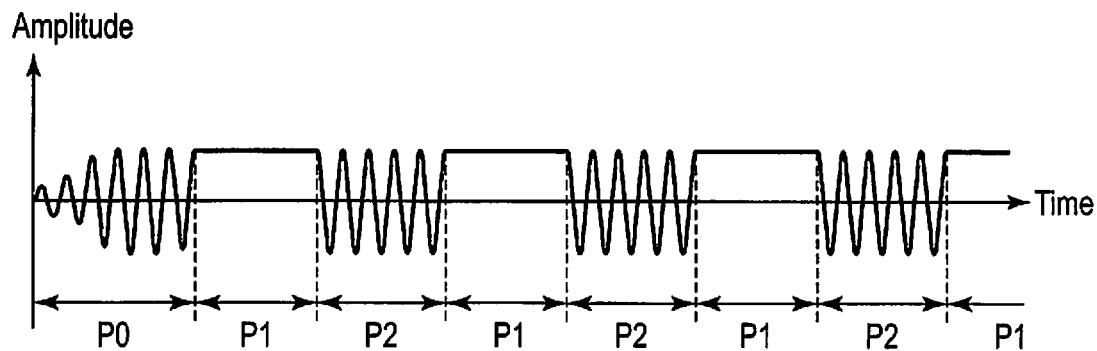
F I G. 3
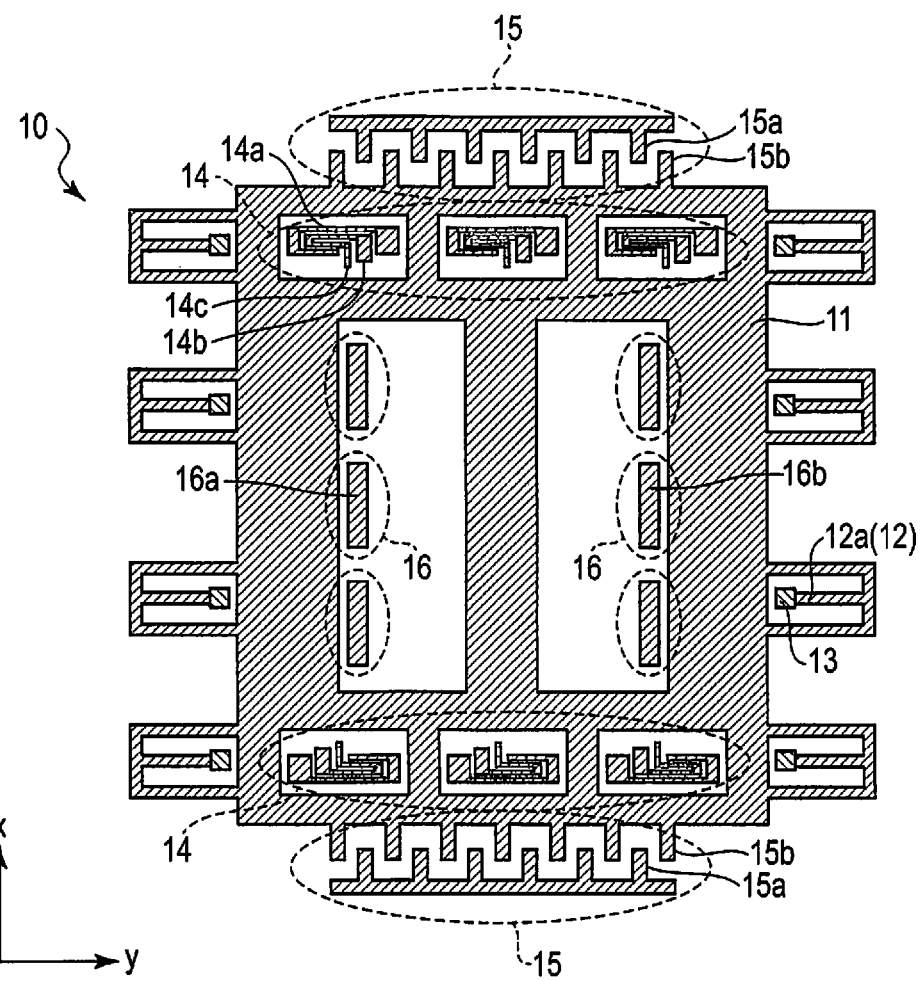
F I G. 4

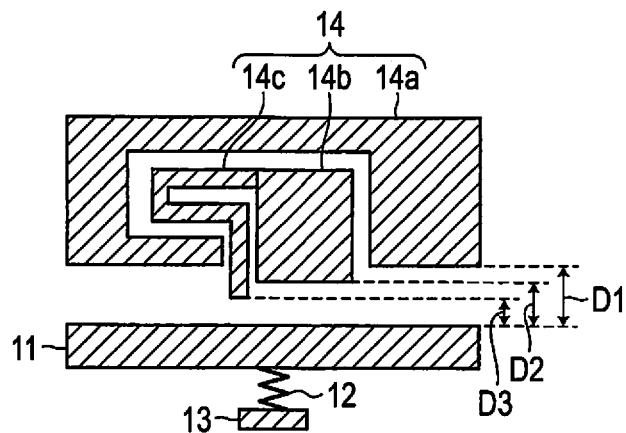
F I G. 5
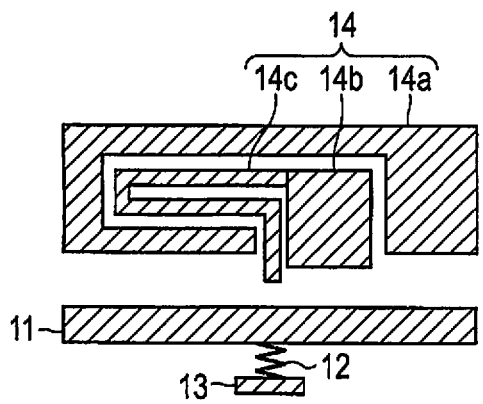
F I G. 6
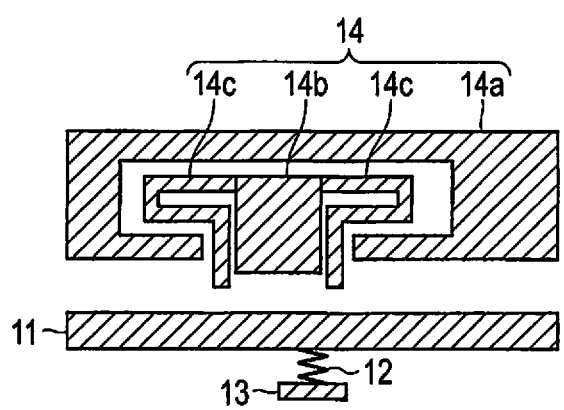
F I G. 7

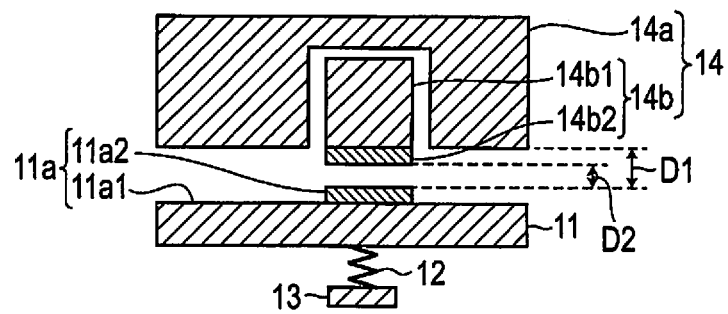
F I G. 10
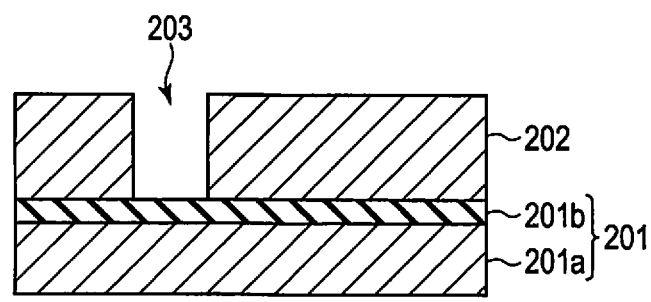
F I G. 11
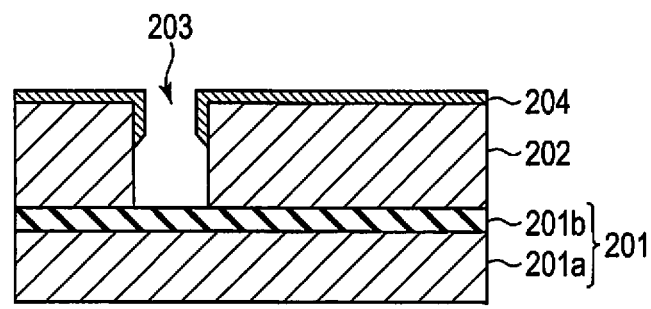
F I G. 12

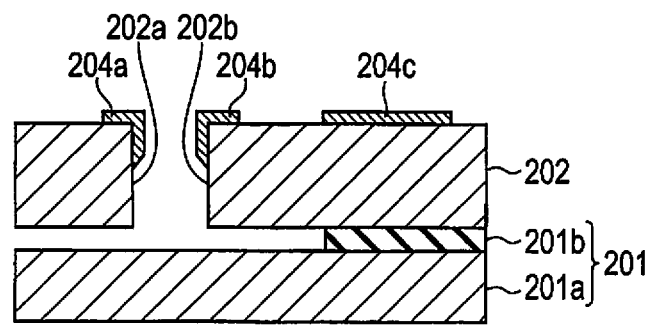
F I G. 16
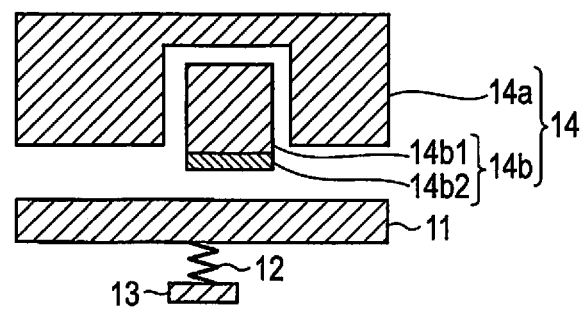
F I G. 17
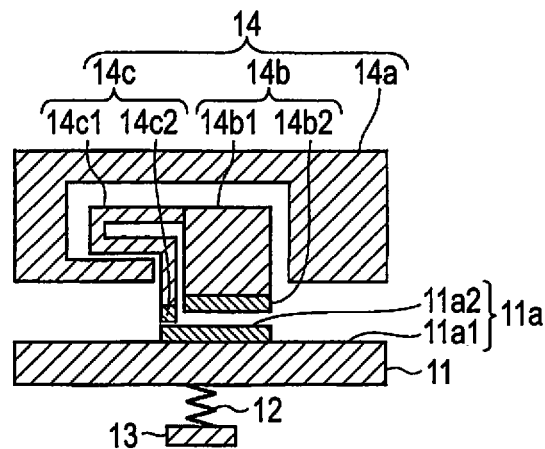
F I G. 18

SENSOR DEVICE EMPLOYING MEMS

CROSS-REFERENCE TO RELATED APPLICATIONS

This application is based upon and claims the benefit of priority from Japanese Patent Application No. 2017-177060, filed Sep. 14, 2017, the entire contents of which are incorporated herein by reference.

FIELD

Embodiments described herein relate generally to a sensor device.

BACKGROUND

As a gyro sensor using micro-electromechanical systems (MEMS) technology, a gyro sensor which sets a movable body from a catch state to a release state, allows the movable body to freely vibrate in an x direction and detects vibration of the movable body in a y direction based on the Coriolis force has been proposed.

However, at the time of catching the movable body, the movable body and a catch-and-release mechanism are mechanically brought into contact with each other, and as a result, an extraneous material may be generated or the movable body or the catch-and-release mechanism may be deformed. These problems may impede an appropriate catch operation.

Therefore, there has been demand for a structure which can prevent generation of the extraneous material and deformation of the movable body or the catch-and-release mechanism in the sensor device having the catch-and-release mechanism.

BRIEF DESCRIPTION OF THE DRAWINGS

FIG. 1 is a block diagram showing the basic and overall structure of a sensor device according to the first embodiment.

FIG. 2 is a schematic plan view showing the structure of a gyro element in the sensor device according to the first embodiment.

FIG. 3 is a timing diagram showing a catch-and-release operation in the sensor device according to the first embodiment.

FIG. 4 is a schematic plan view showing the structure of a modification of the gyro element in the sensor device according to the first embodiment.

FIG. 5 is a schematic diagram showing the structure of the catch-and-release mechanism of the sensor device according to the first embodiment.

FIG. 6 is a schematic diagram showing the structure of the first modification of the catch-and-release mechanism of the sensor device according to the first embodiment.

FIG. 7 is a schematic diagram showing the structure of the second modification of the catch-and-release mechanism of the sensor device according to the first embodiment.

FIG. 10 is a schematic diagram showing the structure of a catch-and-release mechanism of the sensor device according to the second embodiment.

FIG. 11 is a schematic sectional diagram showing part of a manufacturing method of the sensor device according to the second embodiment.

FIG. 12 is a schematic sectional diagram showing part of the manufacturing method of the sensor device according to the second embodiment.

FIG. 16 is a schematic sectional diagram showing part of the manufacturing method of the sensor device according to the second embodiment.

FIG. 17 is a schematic diagram showing the structure of the first modification of the catch-and-release mechanism of the sensor device according to the second embodiment.

FIG. 18 is a schematic diagram showing the structure of the second modification of the catch-and-release mechanism of the sensor device according to the second embodiment.

DETAILED DESCRIPTION

Figure 8A:
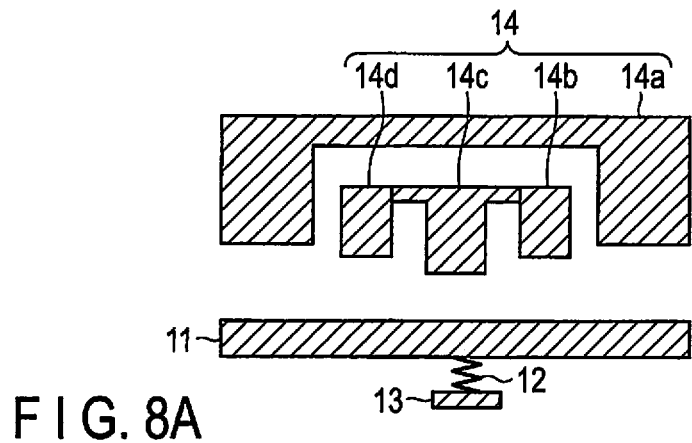
FIG. 8A is a schematic diagram showing the structure of the third modification of the catch-and-release mechanism of the sensor device according to the first embodiment.

In general, according to one embodiment, a sensor device includes: a movable body capable of vibrating; and a catch-and-release mechanism capable of catching the vibrating movable body and capable of releasing the caught movable body. The catch-and-release mechanism includes: a stopper portion capable of stopping vibration of the movable body when the movable body contacts the stopper portion; and an elastic member configured to reduce a force acting between the movable body and the stopper portion.

Embodiments will be described hereinafter with reference to the accompanying drawings.

First Embodiment

FIG. 1 is a block diagram showing the basic and overall structure of a sensor device according to the present embodiment. FIG. 2 is a schematic plan view showing the structure of a gyro element in the sensor device according to the present embodiment. The gyro element is formed on a substrate (semiconductor substrate, etc.) by micro-electro-mechanical systems (MEMS) technology.

As shown in FIG. 1, a sensor device 100 includes a gyro element (MEMS element) 10, an amplitude detection circuit (detection unit) 20, a rotation information acquisition circuit (rotation information acquisition unit) 30 and a control circuit (control unit) 40.

As shown in FIG. 2, the gyro element (MEMS element) 10 includes a movable body 10, a spring mechanism 12, an anchor 13, a catch-and-release mechanism 14, a drive-and-monitoring mechanism 15 and a detection mechanism 16. The gyro element (MEMS element) 10 is formed of a semiconductor material such as silicon (Si) or silicon germanium (SiGe).

The movable body 11 has a movable portion (movable mass) 11a and a movable portion (movable mass) 11b and can vibrate in an x direction (first direction) and a direction perpendicular to the x direction, namely, a y direction (second direction). The movable portion 11a is a movable portion for drive and can vibrate mainly in the x direction (first direction). The movable portion 11b is a movable portion for detection and can vibrate mainly in the y direction (second direction).

The spring mechanism 12 has a spring portion 12a and a spring portion 12b and causes the movable body 11 to vibrate in the x direction and the y direction. The spring portion 12a is connected to the movable portion 11a and is provided to mainly vibrate the movable portion 11a in the x direction. The spring portion 12b is connected to the movable portion 11a and the movable portion 11b and is provided to mainly vibrate the movable portion 11b in the y direction. In the example shown in FIG. 2, the spring mechanism 12 has eight spring portions 12a and four spring portions 12b. If a rotational motion is applied to the movable body 11 freely vibrating in the x direction by the spring mechanism 12, the Coriolis force acts on the movable body 11, and the movable body 11 vibrates in the y direction.

The anchor 13 is provided to support the spring portion 12a and is fixed to an underlying area (not shown). In the example shown in FIG. 2, eight anchors 13 are provided in accordance with the eight spring portions 12.

The catch-and-release mechanism 14 catches the movable body 11 which vibrates in the x direction, and releases the caught movable body 11 and allows the movable body 11 to freely vibrate in the x direction. The catch-and-release mechanism 14 has an electrode portion 14a, a stopper portion 14b and an elastic member 14c.

When a predetermined voltage is applied between the electrode portion 14a and the movable body 11, an electrostatic force (electrostatic attraction) acts between the electrode portion 14a and the movable body 11. Further, when the movable body 11 contacts the stopper portion 14b, the x-directional vibration of the movable body 11 stops. That is, a voltage which brings the movable body 11 into contact with the stopper portion 14b by an electrostatic force acting between the electrode portion 14a and the movable body 11 is applied to the electrode portion 14a, and the movable body 11 is caught by the catch-and-release mechanism 14. When the electrostatic force is reduced by reducing the voltage applied between the electrode portion 14a and the movable body 11, the movable body 11 is released from the catch-and-release mechanism 14, and the movable body 11 starts to freely vibrate in the x direction.

The elastic member 14c reduces a force which acts between the movable body 11 and the stopper portion 14b when the x-directional vibration of the movable body 11 is stopped by the stopper portion 14b. In other words, the elastic member 14c absorbs the force acting between the movable body 11 and the stopper portion 14b when the x-directional vibration of the movable body 11 is stopped by the stopper portion 14b, and reduces the impact force which acts between the movable body 11 and the stopper portion 14b. However, if the elastic member 14c functions (operates) while the movable body 11 is freely vibrating in the x direction, the x-directional free vibration of the movable body 11 may be prevented by the elastic member 14c. Therefore, the elastic member 14c does not function (operate) while the movable body 11 is freely vibrating in the x direction. In the present embodiment, the elastic member 14c is formed of a spring.

The drive-and-monitoring mechanism 15 has an electrode portion 15a and an electrode portion 15b, and has a drive function and a monitoring function with respect to the movable body 11.

The drive function is the function of forcibly driving the movable body 11 in an initial state immediately after the sensor device is powered on. That is, the movable body 11 is not caught by the catch-and-release mechanism 14 in the initial state immediate after the sensor device is powered on. In this initial state, when a predetermined voltage is applied between the electrode portion 15a and the electrode portion 15b, electrostatic attraction acts between the electrode portion 15a and the electrode portion 15b. As a result, the movable body 11 is driven, and the movable body 11 can be caught by the catch-and-release mechanism 14.

The monitoring function is the function of monitoring the x-directional location of the movable body 11 vibrating in the x direction. The x-directional location of the movable body 11 can be monitored by detecting a capacitance between the electrode portion 15a and the electrode portion 15b. For example, the catch timing of the catch-and-release mechanism 14 is determined by monitoring the x-directional location of the movable body 11. In the example shown in FIG. 2, two drive-and-monitoring mechanisms 15 are provided. For example, one drive-and-monitoring mechanism 15 can be used for drive, and the other drive-and-monitoring mechanism 15 can be used for monitoring.

The detection mechanism 16 detects a predetermined physical quantity based on the amplitude of the y-directional vibration of the movable body 11 based on the Coriolis force acting on the movable body 11 vibrating in the x direction, and has an electrode portion 16a and an electrode portion 16b. In the present embodiment, the predetermined physical quantity is a physical quantity based on a capacitance Ca between the movable body 11 and the electrode portion 16a facing the movable body 11 and a capacitance Cb between the movable body 11 and the electrode portion 16b facing the movable body 11. As already described above, if a rotational motion is applied to the movable body 11 freely vibrating in the x direction, the Coriolis force acts on the movable body 11, and the movable body 11 vibrates in the y direction. As a result, the capacitances Ca and Cb vary in accordance with the vibration. Since the electrode portions 16a and 16b are fixed to the underlying area, if one of the capacitances Ca and Cb increases in association with the y-directional vibration of the movable body 11, the other of the capacitances Ca and Cb will decrease.

The amplitude detection circuit 20 shown in FIG. 1 is connected to the electrode portions 16a and 16b of the detection mechanism 16. The amplitude detection circuit 20 detects the amplitude of the y-directional vibration of the movable body 11 based on the predetermined physical quantity (physical quantity based on the capacitances Ca and Cb) detected by the detection mechanism 16. As already described above, if one of the capacitances Ca and Cb increases, the other of the capacitances Ca and Cb will decrease. Therefore, the amplitude detection circuit 20 can detect the amplitude of the y-directional vibration of the movable body 11 based on the difference between the capacitance Ca and the capacitance Cb.

The rotation information acquisition circuit 30 acquires rotation information on the movable body 11 based on the predetermined physical quantity (physical quantity based on the capacitances Ca and Cb) detected by the detection mechanism 16. More specifically, the rotation information acquisition circuit 30 acquires (calculates) an angular velocity or rotation angle of the movable body 11 based on the predetermined physical quantity.

The control circuit 40 controls the operation of the gyro element 10. For example, the control circuit 40 controls the catch-and-release mechanism 14 (controls the catch-and-release operation) and controls the drive-and-monitoring mechanism 15 (controls the drive operation and the monitoring operation), etc.

FIG. 3 is a timing diagram showing the catch-and-release operation in the sensor device according to the present embodiment. In the FIG. 3, the horizontal axis indicates time, and the vertical axis indicates the amplitude of the x-directional vibration of the movable body 11. A set-up period is indicated as P0, a catch period is indicated as P1, and a release period (free vibration period) is indicated as P2. Before starting (before power-on), the movable body 11 is not caught by the catch-and-release mechanism 14. Therefore, the drive-and-monitoring mechanism 15 drives the movable body 11 such that the movable body 11 will be caught by the catch-and-release mechanism 14 in the set-up period P0. Subsequently, the catch period P1 and the release period (free vibration period) P2 are repeated in predetermined cycles, and the predetermined physical quantity is detected in the release period (free vibration period) P2.

FIG. 4 is a schematic plan view showing the structure of a modification of the gyro element in the sensor device according to the present embodiment.

Since the basic structure of the gyro element of the present modification is similar to the structure of the gyro element shown in FIG. 2, description of matters which have already been described will be omitted.

In the gyro element (MEMS element) 10 shown in FIG. 2, the movable body (movable mass) 11 has the movable portion 11a which can mainly vibrates in the x direction and the movable portion 11b which can mainly vibrates in the y direction. The gyro element 10 of the present modification includes the movable body (movable mass) 11 in which the portion movable in the x direction and the portion movable in the y direction are integrated with each other. Therefore, the spring mechanism 12 only has the spring portion 12a. Further, the location of the detection mechanism 16 (electrode portions 16a and 16b) differs from that of the example shown in FIG. 2.

The basic function and basic operation of the gyro element 10 of the present modification are the same as those of the gyro element 10 shown in FIG. 2. Therefore, the same operation as that of the above-described embodiment can also be performed when the gyro element 10 of the present modification is applied to the sensor device 100 shown in FIG. 1.

FIG. 5 is a schematic diagram showing the structure of the catch-and-release mechanism 14. The movable body 11, the spring mechanism 12 and the anchor 13 are simplified in FIG. 5. The catch-and-release mechanism 14 faces the movable body 11 and includes the electrode portion 14a, the stopper portion 14b and the elastic member 14c. As already described above, the elastic member 14c is formed of a spring in the present embodiment. The elastic member 14c is spaced apart from the movable body 11 in a normal state such as a release state (free vibration state).

As shown in FIG. 5, all of the electrode portion 14a, the stopper portion 14b and the elastic member 14c have a facing surface which faces the movable body 11. Assuming that D1 is the distance between the facing surface of the electrode portion 14a and the facing surface of the movable body 11, D2 is the distance between the facing surface of the stopper portion 14b and the movable body 11 and D3 is the distance between the facing surface of the elastic member 14c and the facing surface of the movable body 11, the relationship between D1, D2 and D3 can be expressed as D1>D2>D3. That is, the end of the elastic member 14c is closer to the movable body 11 than the end of the stopper portion 14b, and the elastic member 14c contacts the movable body 11 before the stopper portion 14b contacts the movable body 11.

As already described above, when a predetermined voltage is applied between the electrode portion 14a and the movable body 11, an electrostatic force (electrostatic attraction) acts between the electrode portion 14a and the movable body 11, and the movable body 11 is attracted to the electrode portion 14a. At this time, since the relationship expressed as D1>D2>D3 is established, the movable body 11 contacts the elastic member 14c, and subsequently the movable body 11 contacts the stopper portion 14b. Therefore, the velocity of the movable body 11 can be forcibly reduced by the elastic member 14c before the movable body 11 contacts the stopper portion 14b. As a result, the impact force which acts between the movable body 11 and the stopper portion 14b when the movable body 11 contacts the stopper portion 14b can be reduced.

If the elastic member 14c is not provided, a strong impact force will be applied between the movable body 11 and the stopper portion 14b, and an extraneous material may be generated. If an extraneous material exists between the movable body 11 and the stopper portion 14b, the effective gap (distance) between the movable body 11 and the electrode portion 14a in the catch state will increase, and this may impede an appropriate catch operation. As the number of the catch-and-release operations increases, the amount of the extraneous material increases, and the effective gap (distance) between the movable body 11 and the electrode portion 14a in the catch state increases, accordingly. As a result, the probability of a problem with the catch operation will increase, accordingly.

In the present embodiment, the impact force acting between the movable body 11 and the stopper portion 14b can be reduced by providing the elastic member 14c. Therefore, generation of an extraneous material at a time when the movable body 11 contacts the stopper portion 14b can be prevented, and an appropriate catch-and-release operation can be performed. Consequently, the sensor device including the gyro element 10 excellent in characteristics and reliability can be obtained.

FIG. 6 is a schematic diagram showing the structure of the first modification of the catch-and-release mechanism 14 in the present embodiment. In the present modification, to further reduce the impact force, the length of the spring of the elastic member 14c is increased.

FIG. 7 is a schematic diagram showing the structure of the second modification of the catch-and-release mechanism 14 in the present embodiment. In the present modification, to further reduce the impact force, the elastic members 14c are provided on both sides of the stopper portion 14b.

FIG. 8A is a schematic diagram showing the third modification of the catch-and-release mechanism 14 in the present embodiment. In the present modification, the stopper portions 14b are provided on both sides of the elastic member 14c. In this structure also, the impact force can be reduced by the elastic member 14c.

Figure 8B:
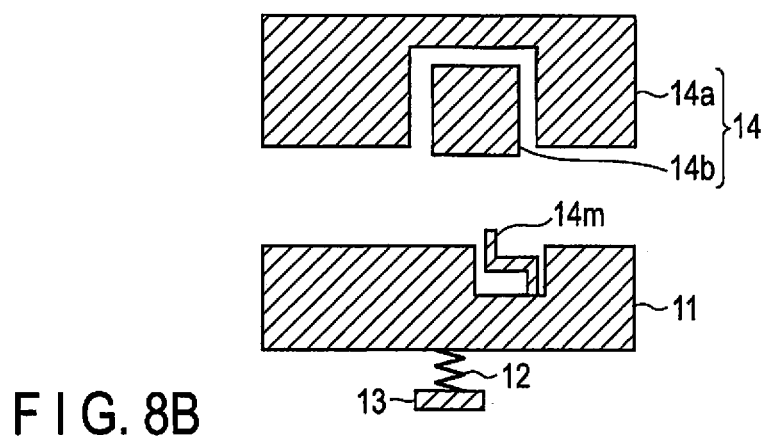
FIG. 8B is a schematic diagram showing the structure of the fourth modification of the catch-and-release mechanism of the sensor device according to the first embodiment.

FIG. 8B is a schematic diagram showing the fourth modification of the catch-and-release mechanism 14 in the present embodiment. Although the elastic member 14c is provided on the stopper portion 14b side in the above-described embodiment, an elastic member 14m is provided on the movable body 11 side in the present modification. In this structure also, the impact force can be reduced by the elastic member 14m.

Figure 8C:
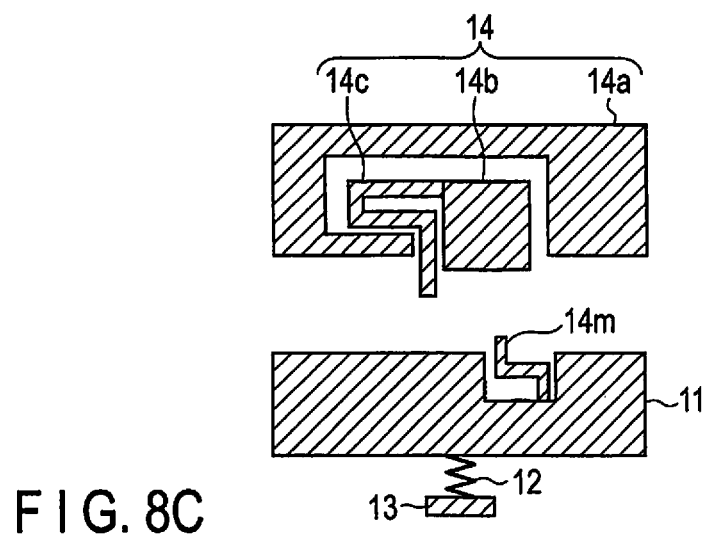
FIG. 8C is a schematic diagram showing the structure of the fifth modification of the catch-and-release mechanism of the sensor device according to the first embodiment.

FIG. 8C is a schematic diagram showing the fifth modification of the catch-and-release mechanism 14 in the present embodiment. In the present modification, the elastic member 14c is provided on the stopper portion 14b side, and the elastic member 14m is provided on the movable body 11 side. In this structure also, the impact force can be reduced by the elastic members 14c and 14m.

Although the elastic member 14c is connected to the stopper portion 14b in the examples shown in FIGS. 5 to 8C, the elastic member 14c may be connected to a portion other than the stopper portion 14b. For example, the elastic member 14c may be connected to the electrode portion 14a, or the elastic member 14c may be connected to the movable body 11.

Second Embodiment

Next, the second embodiment will be described. Since the basic matters are the same as those of the first embodiment, matters which have been described in the first embodiment will be omitted. The basic and overall structure of the sensor device is the same as that shown in FIG. 1.

Figure 9:
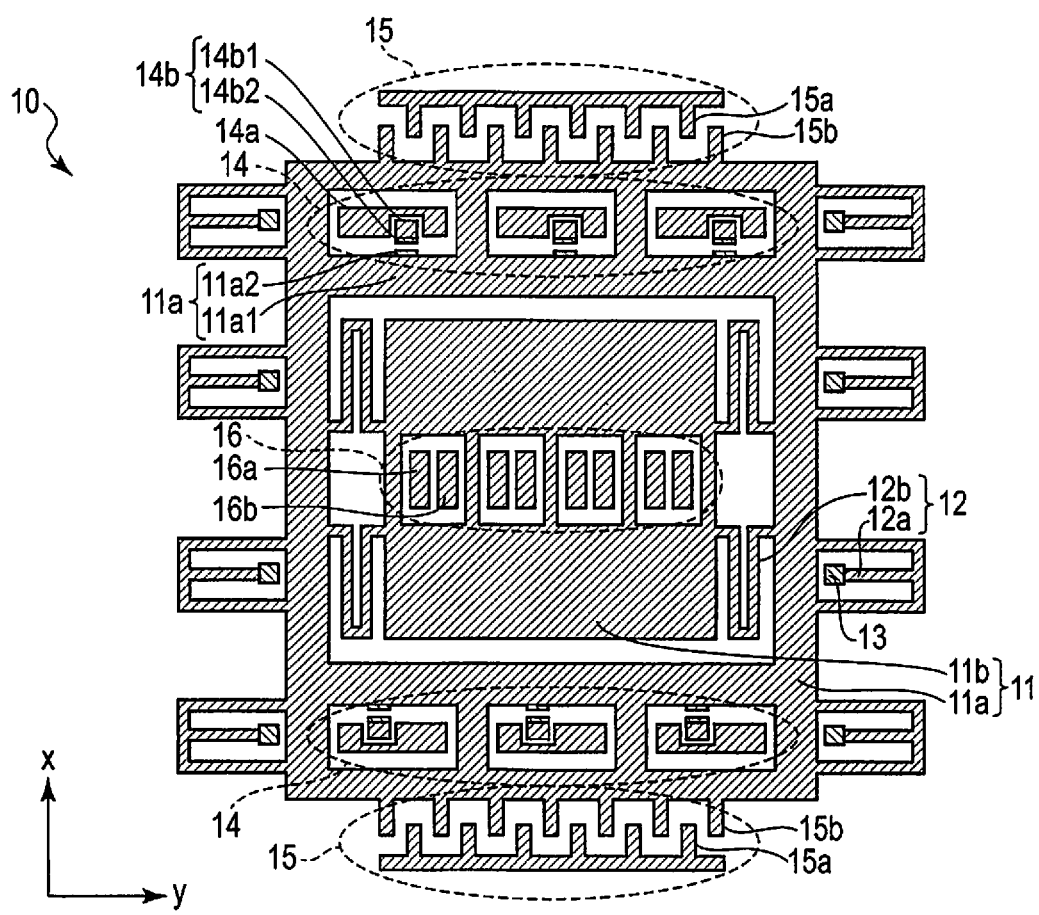
FIG. 9 is a schematic plan view showing the structure of a gyro element in a sensor device according to the second embodiment.

FIG. 9 is a schematic plan view showing the structure of the gyro element in the sensor device according to the present embodiment. The gyro element is formed on the substrate (semiconductor substrate, etc.) by MEMS technology. Since the basic structure of the gyro element shown in FIG. 9 is the same as that of the first embodiment, structural elements corresponding to the structural elements described in the first embodiment will be denoted by the same reference numbers, and detailed description thereof will be omitted.

As shown in FIG. 9, the gyro element (MEMS element) 10 includes the movable body 11, the spring mechanism 12, the anchor 13, the catch-and-release mechanism 14, the drive-and-monitoring mechanism 15 and the detection mechanism 16 in the present embodiment similarly to the first embodiment. The present embodiment differs from the first embodiment in the structure of the catch-and-release mechanism 14.

In the present embodiment also, the catch-and-release mechanism 14 basically has the same function as that of the first embodiment, and catches the movable body 11 which vibrates in the x direction, and releases the caught movable body 11 and allows the movable body 11 to freely vibrate in the x direction. The catch-and-release mechanism 14 includes the electrode portion 14a and the stopper portion 14b.

FIG. 10 is a schematic diagram showing the structure of the catch-and-release mechanism 14. The movable body 11, the spring mechanism 12 and the anchor 13 are simplified in FIG. 10. The catch-and-release mechanism 14 faces the movable body 11 and includes the electrode portion 14a and the stopper portion 14b.

The stopper portion 14b has a main body portion 14b1 and a contact portion 14b2 which contacts the movable body 11 and is formed of a metal material. The main body portion 14b1 is formed of a semiconductor material such as silicon (Si) or silicon germanium (SiGe). A highly-ductile and highly-malleable metal material is used as the metal material of the contact portion 14b2. More specifically, the metal material of the contact portion 14b2 contains a metal element selected from among gold (Au), copper (Cu) and aluminum (Al) as a main component. Therefore, the contact portion 14b2 is more ductile and more malleable than the main body portion 14b1.

Further, the movable body 11 also has a main body portion 11a1 and a contact portion 11a2 which contacts the stopper portion 14b and is formed of a metal material. The main body portion 11a1 is formed of a semiconductor material such as a silicon (Si) or silicon germanium (SiGe). A highly-ductile and highly-malleable metal material is used as the metal material of the contact portion 11a2. More specifically, the metal material of the contact portion 11a2 contains a metal element selected from among gold (Au), copper (Cu) and aluminum (Al) as a main component. Therefore, the contact portion 11a2 is more ductile and more malleable than the main body portion 11a1. As shown in FIG. 10, both the electrode portion 14a and the stopper portion 14b have a facing surface which faces the movable body 11. Assuming that D1 is the distance between the facing surface of the electrode portion 14a and the facing surface of the movable body 11 and D2 is the distance between the facing surface of the stopper portion 14b and the facing surface of the movable body 11, the relationship between D1 and D2 can be expressed as D1>D2.

As already described above, in the catch operation by the catch-and-release mechanism 14, an impact force will be applied between the movable body 11 and the stopper portion 14b when the movable body 11 contacts the stopper portion 14b. Therefore, an extraneous material may be generated by the impact.

In the present embodiment, a highly-ductile and highly-malleable metal material is used for the contact portion 11a2 and the contact portion 14b2. Therefore, even if an impact force is applied between the movable body 11 and the stopper portion 14b, the contact portion 11a2 and the contact portion 14b2 are less likely to be broken. Further, the impact force itself acting between the movable body 11 and the stopper portion 14b can be reduced by using the highly-ductile and highly-malleable metal material for the contact portion 11a2 and the contact portion 14b2. Therefore, generation of an extraneous material can be prevented by the structure of the present embodiment.

Accordingly, in the present embodiment also, generation of an extraneous material at a time when the movable body 11 contacts the stopper portion 14b can be prevented, and an appropriate catch-and-release operation can be performed. Consequently, the sensor device including the gyro element 10 excellent in characteristics and reliability can be obtained.

Next, a method of manufacturing the sensor device, more specifically, a method of manufacturing the gyro element according to the present embodiment will be described with reference to the FIGS. 11 to 16.

Firstly, a semiconductor film 202 having a thickness of about 20 μm is formed on an underlying area 201 as shown in FIG. 11. The underlying area includes a semiconductor area (for example, a silicon area) 201a and an insulating area (for example, a silicon oxide film area) 201b, etc. A silicon (Si) film or silicon germanium (SiGe), etc., is used as the semiconductor film 202. Subsequently, an opening 203 having a width of about 2 to 5 μm is formed in the semiconductor film 202.

Subsequently, a metal material film 204 is formed by sputtering on the entire surface as shown in FIG. 12. A metal material containing a metal element selected from among gold (Au), copper (Cu) and aluminum (Al) as a main component is used for the metal material film 204. In the present embodiment, a gold (Au) film is used as the metal material film 204. Since the metal material film 204 is formed by means of sputtering, the metal material film 204 is not formed on the bottom surface of the opening 203 and the lower portion of the inner wall of the opening 203. In other words, the metal material film 204 is formed on the upper surface of the semiconductor film 202 and the upper portion of the inner wall of the opening 203.

Figure 13:
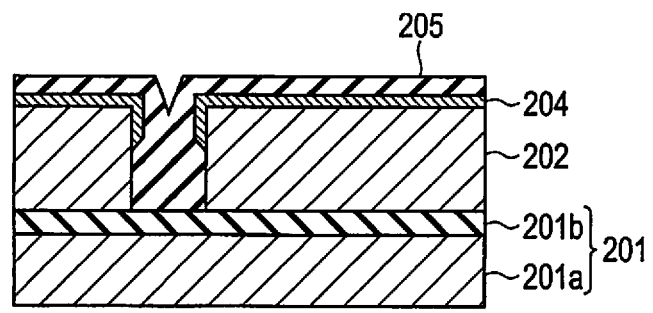
FIG. 13 is a schematic sectional diagram showing part of the manufacturing method of the sensor device according to the second embodiment.

Subsequently, a photoresist film 205 is formed on the entire surface as shown in FIG. 13. The opening 203 is filled with the photoresist film 205. In place of the photoresist film 205, a hard mask film such as a silicon oxide film may also be used.

Figure 14:
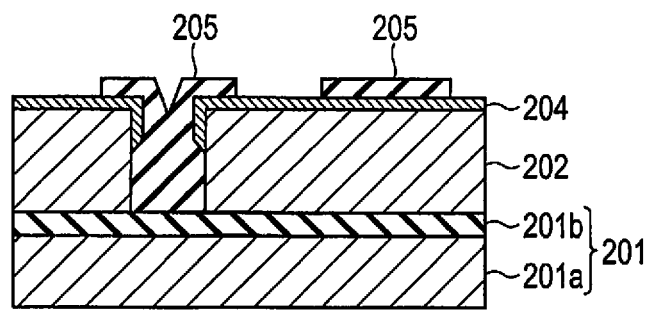
FIG. 14 is a schematic sectional diagram showing part of the manufacturing method of the sensor device according to the second embodiment.

Subsequently, a photoresist pattern is formed by patterning the photoresist film 205 as shown in FIG. 14.

Figure 15:
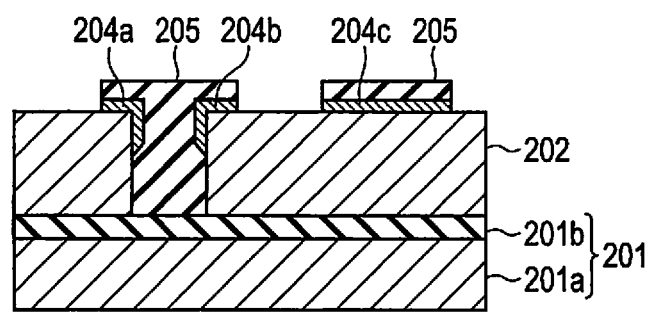
FIG. 15 is a schematic sectional diagram showing part of the manufacturing method of the sensor device according to the second embodiment.

Subsequently, the metal material film 204 is etched through the photoresist pattern 205 used as a mask as shown in FIG. 15. In this way, metal material film patterns 204a, 204b and 204c are formed.

Subsequently, the photoresist pattern 205 and part of the insulating area 201b are removed as shown in FIG. 16. As a result, a contact portion of a movable body (corresponding to the contact portion 11a2 shown in FIG. 10) is obtained from the metal material film pattern 204a, a contact portion of a stopper portion (corresponding to the contact portion 14b2 shown in FIG. 10) is obtained from the metal material film pattern 204b, and a pad portion of the stopper portion is obtained from the metal material film pattern 204c.

A structure shown in FIGS. 10 and 16 can be obtained by the above-described manufacturing method. That is, a structure in which the contact portion 14b2 is provided in the stopper portion 14b and the contact portion 11a2 is provided in the movable body 11 (11a) can be obtained. More specifically, as shown in FIGS. 10 and 16, the main body portion 14b1 of the stopper portion 14b has a first facing surface 202b facing the movable body 11a, and the main body portion 11a1 of the movable body 11a has a second facing surface 202a facing the stopper portion 14b. The contact portion 14b2 (204b) of the stopper portion 14b is provided on the upper portion of the first facing surface 202b and is not provided on the lower portion of the first facing surface 202b. The contact portion 11a2 (204a) of the movable body 11a is provided on the upper portion of the second facing surface 202a and is not provided on the lower portion of the second facing surface 202a.

FIG. 17 is a schematic diagram showing the structure of the first modification of the catch-and-release mechanism 14 in the present embodiment. In the present modification, the contact portion 14b2 is provided in the stopper portion 14b, but the above-described contact portion is not provided in the movable body 11. In this way, the contact portion may only be provided in one of the stopper portion 14b and the movable body 11.

FIG. 18 is a schematic diagram showing the structure of the second modification of the catch-and-release mechanism 14 in the present embodiment. In addition to the contact portions 11a2 and 14b2, the elastic member 14c described in the first embodiment is also provided in the present modification. Further, in addition to the main body portion 14c1, a contact portion 14c2 is further provided in the elastic member 14c. In this way, the structure of the present embodiment and the structure of the first embodiment may be combined with each other.

Figure 19:
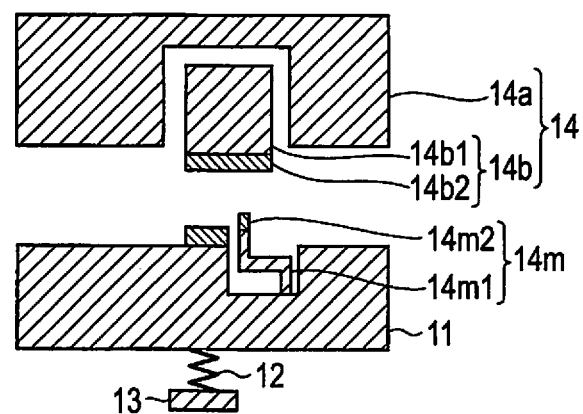
FIG. 19 is a schematic diagram showing the structure of the third modification of the catch-and-release mechanism of the sensor device according to the second embodiment.

FIG. 19 is a schematic diagram showing the structure of the third modification of the catch-and-release mechanism 14 in the present embodiment. In the present modification, the elastic member 14m is provided on the movable body 11 side, and a contact portion 14m2 is further provided at the end of a main body portion 14m1 of the elastic member 14m. In this way, the structure of the present embodiment and the structure of the first embodiment may be combined with each other.

Figure 20:
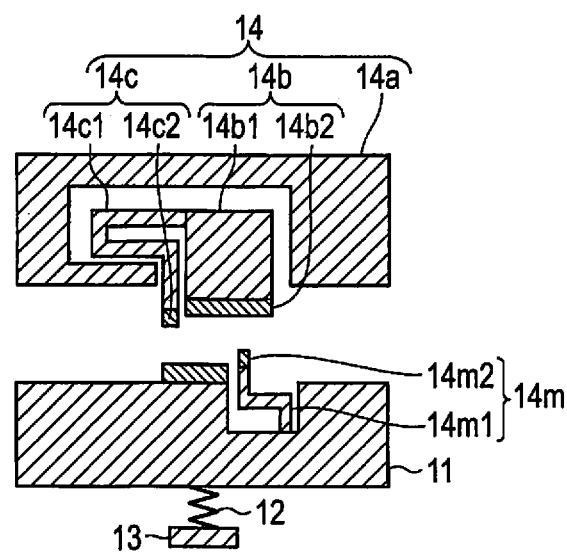
FIG. 20 is a schematic diagram showing the structure of the fourth modification of the catch-and-release mechanism of the sensor device according to the second embodiment.

FIG. 20 is a schematic diagram showing the structure of the fourth modification of the catch-and-release mechanism 14 in the present embodiment. In the present modification, the elastic member 14c is provided on the stopper portion 14b side, and the elastic member 14m is provided on the movable body 11 side. Further, a contact portion 14c2 is provided at the end of a main body portion 14c1 of the elastic member 14c, and the contact portion 14m2 is provided at the end of the main body portion 14m1 of the elastic member 14m. In this way, the structure of the present embodiment and the structure of the first embodiment may be combined with each other.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A sensor device comprising:
   a movable body capable of vibrating in a first direction; and
   a catch-and-release mechanism capable of catching and releasing the movable body, wherein
   the catch-and-release mechanism includes:
      a stopper portion capable of reducing vibration of the movable body when the movable body contacts the stopper portion; and
      an elastic member provided to the stopper portion and disconnectable from the movable body,
   a first distance between the movable body and the elastic member is less than a second distance between the movable body and the stopper portion in the first direction.
2. The sensor device of claim 1, wherein the elastic member is spaced apart from the movable body.
3. The sensor device of claim 1, wherein
   the elastic member contacts the movable body before the stopper portion contacts the movable body.
4. The sensor device of claim 1, wherein
   the movable body is capable of vibrating in a second direction perpendicular to the first direction; and
   the sensor device further comprises a detection mechanism capable of detecting a predetermined physical quantity based on an amplitude of vibration of the movable body in the second direction based on a Coriolis force acting on the movable body vibrating in the first direction.

5. The sensor device of claim 1, wherein the elastic member is configured to reduce the force when vibration of the movable body is reduced by the stopper portion.

6. The sensor device of claim 1, wherein the elastic member does not function while the movable body is freely vibrating.

7. The sensor device of claim 1, wherein the elastic member is connected to the stopper portion.

8. The sensor device of claim 1, wherein the catch-and-release mechanism includes an electrode portion and a movable portion.

9. The sensor device of claim 8, wherein the electrode portion and the movable portion are configured to be applied a voltage.

10. The sensor device of claim 8, wherein the elastic member is connected to the electrode portion or the movable portion.

11. The sensor device of claim 8, wherein the predetermined physical quantity includes a capacitance between the electrode portion and the movable portion.

12. The sensor device of claim 1, wherein the stopper portion is configured to reduce the vibration of the movable body by using electrostatic force.

13. The sensor device of claim 1, wherein the movable body is in contact with the stopper portion when the stopper portion stops the vibration of the movable portion.

* * * * *